United States Patent
Kasuga et al.

(10) Patent No.: US 10,076,028 B2
(45) Date of Patent: *Sep. 11, 2018

(54) SUBSTRATE FOR PRINTED CIRCUIT BOARD, PRINTED CIRCUIT BOARD, AND METHOD FOR PRODUCING PRINTED CIRCUIT BOARD

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Takashi Kasuga, Osaka (JP); Yoshio Oka, Osaka (JP); Shigeaki Uemura, Osaka (JP); Jinjoo Park, Koka (JP); Hiroshi Ueda, Koka (JP); Kousuke Miura, Koka (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/544,961

(22) PCT Filed: Jan. 19, 2016

(86) PCT No.: PCT/JP2016/051479
§ 371 (c)(1),
(2) Date: Jul. 20, 2017

(87) PCT Pub. No.: WO2016/117575
PCT Pub. Date: Jul. 28, 2016

(65) Prior Publication Data
US 2018/0014403 A1    Jan. 11, 2018

(30) Foreign Application Priority Data

Jan. 22, 2015 (JP) .................................. 2015-010038

(51) Int. Cl.
*H05K 1/09* (2006.01)
*H05K 1/02* (2006.01)
(Continued)

(52) U.S. Cl.
CPC ......... *H05K 1/0298* (2013.01); *C23C 28/023* (2013.01); *H05K 1/09* (2013.01);
(Continued)

(58) Field of Classification Search
CPC ...... H05K 1/092; H05K 1/097; H05K 1/0243; H05K 1/05; H05K 3/025; H05K 3/064; H05K 3/108
See application file for complete search history.

(56) References Cited

U.S. PATENT DOCUMENTS

| 3,322,881 A | 5/1967 | Schneble et al. |
| 3,767,538 A | 10/1973 | Politycki et al. |

(Continued)

FOREIGN PATENT DOCUMENTS

| CN | 1527655 A | 9/2004 |
| EP | 2150095 A1 | 2/2010 |

(Continued)

OTHER PUBLICATIONS

U.S. Office Action dated Dec. 15, 2016 that issued in U.S. Appl. No. 13/265,108.
(Continued)

*Primary Examiner* — Chau N Nguyen
*Assistant Examiner* — Roshn Varghese
(74) *Attorney, Agent, or Firm* — Drinker Biddle & Reath LLP (57) ABSTRACT

A substrate for a printed circuit board according to an embodiment of the present invention includes a base film having insulating properties and a sintered layer formed of a plurality of metal particles, the sintered layer being stacked on at least one surface of the base film, in which a region of (Continued)

the sintered layer extending from an interface between the sintered layer and the base film to a position 500 nm or less from the interface has a porosity of 1% or more and 50% or less.

9 Claims, 3 Drawing Sheets

(51) Int. Cl.
H05K 3/42 (2006.01)
C23C 28/02 (2006.01)
H05K 3/18 (2006.01)
H05K 3/06 (2006.01)
H05K 3/10 (2006.01)
H05K 3/12 (2006.01)
H05K 3/40 (2006.01)
H05K 3/02 (2006.01)

(52) U.S. Cl.
CPC ............ *H05K 3/025* (2013.01); *H05K 3/064* (2013.01); *H05K 3/108* (2013.01); *H05K 3/1283* (2013.01); *H05K 3/188* (2013.01); *H05K 3/4038* (2013.01); *H05K 3/424* (2013.01)

(56) References Cited

U.S. PATENT DOCUMENTS

| | | | |
|---|---|---|---|
| 4,959,121 A | 9/1990 | Dumas et al. | |
| 5,196,232 A | 3/1993 | Kitazaki et al. | |
| 5,383,093 A | 1/1995 | Nagasaka | |
| 5,652,042 A | 7/1997 | Kawakita et al. | |
| 5,739,055 A | 4/1998 | Ryu et al. | |
| 6,258,223 B1 | 7/2001 | Cheung et al. | |
| 6,277,353 B1 | 8/2001 | Gard et al. | |
| 6,337,037 B1 | 1/2002 | St. John | |
| 6,379,845 B1 | 4/2002 | Inazawa et al. | |
| 6,486,409 B1 | 11/2002 | Sako | |
| 6,730,400 B1 | 5/2004 | Komatsu et al. | |
| 7,470,306 B2 | 12/2008 | Inazawa et al. | |
| 8,764,960 B2 | 7/2014 | Chung et al. | |
| 2002/0004180 A1 | 1/2002 | Hotta et al. | |
| 2003/0146019 A1 | 8/2003 | Hirai | |
| 2004/0134682 A1 | 7/2004 | En et al. | |
| 2004/0185388 A1 | 9/2004 | Hirai | |
| 2005/0189520 A1 | 9/2005 | Okada et al. | |
| 2006/0043346 A1 | 3/2006 | Kodas et al. | |
| 2006/0055021 A1 | 3/2006 | Yamamoto | |
| 2006/0163744 A1 | 7/2006 | Vanheusden et al. | |
| 2007/0153488 A1 | 7/2007 | Yang et al. | |
| 2007/0216292 A1 | 9/2007 | Seo et al. | |
| 2007/0261234 A1 | 11/2007 | Song et al. | |
| 2008/0075836 A1 | 3/2008 | Chen et al. | |
| 2008/0083698 A1 | 4/2008 | Jung et al. | |
| 2008/0157029 A1 | 7/2008 | Lee et al. | |
| 2008/0268637 A1 | 10/2008 | Inaba | |
| 2009/0139868 A1 | 6/2009 | Shrader et al. | |
| 2009/0142648 A1 | 6/2009 | Kohl et al. | |
| 2009/0202915 A1 | 8/2009 | Modeki et al. | |
| 2009/0236137 A1 | 9/2009 | Kaneda et al. | |
| 2009/0242854 A1 | 10/2009 | Li et al. | |
| 2010/0025080 A1 | 2/2010 | Park et al. | |
| 2010/0044094 A1 | 2/2010 | Oka et al. | |
| 2010/0132986 A1 | 6/2010 | Hackert et al. | |
| 2010/0261031 A1 | 10/2010 | Chung et al. | |
| 2012/0031656 A1 | 2/2012 | Oka et al. | |
| 2014/0166495 A1 | 6/2014 | Oka et al. | |
| 2015/0147486 A1* | 5/2015 | Abed | H05K 1/097 427/559 |
| 2017/0127516 A1* | 5/2017 | Kasuga | H05K 1/092 |

FOREIGN PATENT DOCUMENTS

| | | |
|---|---|---|
| JP | H05-259615 A | 10/1993 |
| JP | H06-120640 A | 4/1994 |
| JP | H08-167768 A | 6/1996 |
| JP | H10-18080 A | 1/1998 |
| JP | H10-284842 A | 10/1998 |
| JP | 2000-087121 A | 3/2000 |
| JP | 2000-323618 A | 11/2000 |
| JP | 2001-168496 A | 6/2001 |
| JP | 2002-299833 A | 10/2002 |
| JP | 2003-209341 A | 7/2003 |
| JP | 2004-266133 A | 9/2004 |
| JP | 3570802 B2 | 9/2004 |
| JP | 35708020 B2 | 9/2004 |
| JP | 2004-323866 A | 11/2004 |
| JP | 2005-050965 A | 2/2005 |
| JP | 2005-174828 A | 6/2005 |
| JP | 2005-203484 A | 7/2005 |
| JP | 2005-235533 A | 9/2005 |
| JP | 2005-239472 A | 9/2005 |
| JP | 2006-024808 A | 1/2006 |
| JP | 2006-156617 A | 6/2006 |
| JP | 2006-278845 A | 10/2006 |
| JP | 2006-303368 A | 11/2006 |
| JP | 2007-027454 A | 2/2007 |
| JP | 2007-066824 A | 3/2007 |
| JP | 2008-085345 A | 4/2008 |
| JP | 2008-168585 A | 7/2008 |
| JP | 2008-283012 A | 11/2008 |
| JP | 2012-114152 A | 6/2012 |
| JP | 2013-118362 A | 6/2013 |
| JP | 2013-254910 A | 12/2013 |
| WO | WO 00/10736 A1 | 3/2000 |
| WO | WO 00/33625 A | 6/2000 |
| WO | WO 02/096168 A2 | 11/2002 |
| WO | WO 2007/015545 A1 | 2/2007 |
| WO | WO 2007/112971 A2 | 10/2007 |
| WO | WO-2010/122918 A1 | 10/2010 |

OTHER PUBLICATIONS

U.S. Office Action dated Jan. 12, 2017 that issued in U.S. Appl. No. 14/185,206.
U.S. Advisory Action dated Apr. 12, 2017 that issued in related U.S. Appl. No. 14/185,206.
U.S. Office Action dated Apr. 19, 2017 that issued in related U.S. Appl. No. 13/265,108.
U.S. Office Action dated Apr. 6, 2017 including an Election/Restriction Requirement that issued in related U.S. Appl. No. 15/127,203.
U.S. Office Action dated Apr. 11, 2017 including an Election/Restriction Requirement that issued in related U.S. Appl. No. 15/127,165.
U.S. Office Action dated Jun. 8, 2017 that issued in related U.S. Appl. No. 14/185,206.
U.S. Office Action dated Jul. 14, 2017 that issued in related U.S. Appl. No. 15/127,203.
Final Office Action dated Sep. 15, 2017 that issued in related U.S. Appl. No. 14/185,206.
U.S. Office Action dated Oct. 19, 2017 that issued in related U.S. Appl. No. 15/214,278.
KR 10-2012-0051991—May 23, 2012—Report Information from ProQuest Dialog—including English-language Abstract—as attached to U.S. Office Action dated Jan. 11, 2018 that issued in related U.S. Appl. No. 15/127,203.
U.S. Office Action dated Dec. 19, 2017 that issued in related U.S. Appl. No. 14/185,206.
U.S. Office Action dated Jan. 11, 2018 that issued in related U.S. Appl. No. 15/127,203.
U.S. Notice of Allowance dated Aug. 2, 2017 that issued in related U.S. Appl. No. 15/127,165.
U.S. Office Action dated Sep. 21, 2017 that issued in related U.S. Appl. No. 15/213,216,
U.S. Appl. No. 15/213,216, filed Jul. 18, 2016, Oka.

(56) References Cited

OTHER PUBLICATIONS

U.S. Appl. No. 15/214,278, filed Jul. 19, 2016, Oka.
U.S. Appl. No. 15/127,203, filed Sep. 19, 2016, Kasuga et al.
U.S. Notice of Allowance dated Oct. 25, 2017 that issued in related U.S Appl. No. 15/127,165.
U.S. Notice of Allowance dated Dec. 21, 2017 that issued in related U.S Appl. No. 15/127,165.
U.S. Notice of Allowance dated Feb. 7, 2018 that issued in related U.S Appl. No. 15/127,165.
U.S. Office Action dated Mar. 7, 2018 that issued in U.S Appl. No. 15/213,216.
U.S. Office Action dated Mar. 8, 2018 that issued in U.S Appl. No. 15/214,278.
U.S. Notice of Allowance dated May 23, 2018 that issued in related U.S. Appl. No. 15/127,165.
Final Office Action dated May 2, 2018 that issued in U.S. Appl. No. 14/185,206.

* cited by examiner

SUBSTRATE FOR PRINTED CIRCUIT BOARD, PRINTED CIRCUIT BOARD, AND METHOD FOR PRODUCING PRINTED CIRCUIT BOARD

TECHNICAL FIELD

The present invention relates to a substrate for a printed circuit board, a printed circuit board, and a method for producing a printed circuit board.

BACKGROUND ART

A substrate for printed circuit boards, the substrate including a metal layer on a surface of an insulating base film has been widely used, the substrate being to be formed into a flexible printed circuit board by etching the metal layer to form a conductive pattern.

In recent years, trends toward miniaturization and higher performance of electronic devices require higher-density printed circuit boards. As a substrate for a printed circuit board that satisfies the demand for a higher density, a substrate for a printed circuit board has been require to include a conductive layer with a smaller thickness.

Such a substrate for a printed circuit board is also required to have a high peel strength between the base film and the metal layer so as not to allow the metal layer to be peeled from the base film when a flexible printed circuit board is subjected to a bending stress.

To deal with these demands, a substrate for a printed circuit board, the substrate including a thin copper layer laminated on a heat-resistant insulating base film without an adhesive layer provided therebetween has been reported (see Japanese Patent No. 3570802). In the substrate for a printed circuit board described in the patent publication, the thin copper layer is formed by a sputtering method on both surfaces of the heat-resistant insulating base film, and then a thick copper layer is formed thereon by an electrolytic plating method.

CITATION LIST

Patent Literature

PTL 1: Japanese Patent No. 3570802

SUMMARY OF INVENTION

Technical Problem

In the substrate for a printed circuit board described in the foregoing patent publication, because the thin copper layer is formed by sputtering on the surfaces of the heat-resistant base film, vacuum equipment for production is needed. Thus, in production equipment for the substrate for a printed circuit board described in the patent publication, the construction cost, the maintenance cost, and the operating cost are relatively high. In the substrate for a printed circuit board described in the foregoing patent publication, because the vacuum equipment is used for the production, the handling of materials and products is complicated. This is also a factor in increasing the production cost. In the case where the substrate for a printed circuit board described in the patent publication is increased in size, large vacuum equipment is needed, thus markedly increasing the equipment cost.

The present invention has been accomplished in light of the foregoing circumstances. It is an object of the present invention to provide a substrate for a printed circuit board, the substrate having a high peel strength between a base film and a metal layer and being capable of being produced at a low cost, a printed circuit board, and a method for producing a printed circuit board.

Solution to Problem

A substrate for a printed circuit board according to an aspect of the present invention to solve the foregoing problems includes a base film having insulating properties, and a sintered layer formed of a plurality of metal particles, the sintered layer being stacked on at least one surface of the base film, in which a region of the sintered layer extending from an interface between the sintered layer and the base film to a position 500 nm or less from the interface has a porosity of 1% or more and 50% or less.

A method for producing a substrate for a printed circuit board according to another aspect of the present invention to solve the foregoing problems, the substrate including a base film having insulating properties and a sintered layer formed of a plurality of metal particles, the sintered layer being stacked on at least one surface of the base film, includes the steps of applying an ink containing the metal particles to one surface of the base film having insulating properties, and sintering a coating of the ink that has been formed in the application step, in which in the sintering step or a downstream step thereof, a porosity of a region of the sintered layer that has been formed by sintering the coating, the region extending from an interface between the sintered layer and the base film to a position 500 nm or less from the interface, is adjusted to 1% or more and 50% or less.

Advantageous Effects of Invention

According to the present invention, the substrate for a printed circuit board according to an embodiment of the present invention has a high peel strength between the base film and the metal layer can be produced at a low cost.

DESCRIPTION OF EMBODIMENTS

[Description of Embodiments of Invention]

A substrate for a printed circuit board according to an embodiment of the present invention includes a base film having insulating properties and a sintered layer formed of a plurality of metal particles, the sintered layer being stacked on at least one surface of the base film, in which a region of the sintered layer extending from the interface between the sintered layer and the base film to a position 500 nm or less from the interface has a porosity of 1% or more and 50% or less.

In the substrate for a printed circuit board, because the porosity of the region of the sintered layer extending from the interface between the sintered layer and the base film to a position 500 nm or less from the interface is in the range described above, the peel strength between the base film and the sintered layer can be improved without impairing the strength of the sintered layer or the base film due to excessive heat during sintering. The substrate for a printed circuit board can be produced without special equipment such as vacuum equipment and thus can be produced at a relatively low cost despite a large peel strength between the base film and the metal film, i.e., the sintered layer.

A metal oxide derived from the metal of the metal particles, a group derived from the metal oxide, a metal hydroxide derived from the metal, or a group derived from the metal hydroxide is preferably present in the vicinity of the interface between the base film and the sintered layer. When the metal oxide derived from the metal of the metal particles, the group derived from the metal oxide, the metal hydroxide derived from the metal, or the group derived from the metal hydroxide is present in the vicinity of the interface between the base film and the sintered layer, the adhesion between the base film and the sintered layer is improved, thereby further improving the peel strength between the base film and the metal layer.

The metal oxide or the group derived from the metal oxide in the vicinity of the interface between the base film and the sintered layer is preferably present in an amount of 0.1 $\mu g/cm^2$ or more and 10 $\mu g/cm^2$ or less per unit area. When the metal oxide or the group derived from the metal oxide in the vicinity of the interface between the base film and the sintered layer is present in an amount within the range described above, the peel strength between the base film and the sintered layer can be improved without impairing the strength of the sintered layer.

The metal oxide derived from the metal of the metal particles or the group derived from the metal oxide and the metal hydroxide derived from the metal or the group derived from the metal hydroxide are preferably present, and the ratio of the amount of the metal oxide or the group derived from the metal oxide present to the amount of the metal hydroxide or the group derived from the metal hydroxide present is preferably 0.1 or more. In the case where the metal oxide derived from the metal of the metal particles or the group derived from the metal oxide and the metal hydroxide derived from the metal or the group derived from the metal hydroxide are present and where the ratio of the amount of the metal oxide or the group derived from the metal oxide present to the amount of the metal hydroxide or the group derived from the metal hydroxide present is equal to or more than the lower limit described above, the peel strength between the base film and the sintered layer can be further reliably improved.

The metal particles preferably have an average particle size of 1 nm or more and 500 nm or less. When the metal particles have an average particle size within the range described above, the dense sintered layer having a low porosity can be relatively easily formed, thereby further improving the peel strength between the base film and the metal layer.

Each of the metal particles is preferably composed of copper or a copper alloy as a main component. When each of the metal particles is composed of copper or a copper alloy as a main component, the metal layer having a relatively good conductivity can be formed at a low cost.

A non-electrolytic plating layer is preferably provided on an outer surface of the sintered layer. When the non-electrolytic plating layer is provided on the outer surface of the sintered layer, a metal is charged into pores formed during the sintering of the metal particles; thus, the porosity of the sintered layer is easily reduced, thereby further improving the peel strength between the base film and the metal layer.

Preferably, an electrolytic plating layer stacked on the side of the outer surface of the sintered layer is further provided. When the electrolytic plating layer stacked on the side of the outer surface of the sintered layer is further provided, the metal layer having a desired thickness can be easily and reliably formed at a low cost.

Preferably, a hydrophilized layer is further provided on the surface of the base film on which the sintered layer is stacked. When the hydrophilized layer is further provided on the surface of the base film on which the sintered layer is stacked, the peel strength between the base film and the sintered layer can be further improved.

A printed circuit board according to an embodiment of the present invention includes the substrate for a printed circuit board, the sintered layer being patterned.

In the printed circuit board, a conductive pattern (a metal layer including the patterned sintered layer) is formed from the substrate for a printed circuit board, the substrate being inexpensive and having a high peel strength between the base film and the sintered layer; thus, the peel strength between the base film and the metal layer is high.

A method for producing a substrate for a printed circuit board according to an embodiment of the present invention, the substrate including a base film having insulating properties and a sintered layer formed of a plurality of metal particles, the sintered layer being stacked on at least one surface of the base film, includes the steps of applying an ink containing the metal particles to one surface of the base film having insulating properties, and sintering the resulting coating of the ink that has been formed in the coating step, in which in the sintering step or its downstream step, the porosity of a region of the sintered layer that has been formed by sintering the coating, the region extending from the interface between the sintered layer and the base film to a position 500 nm or less from the interface, is adjusted to 1% or more and 50% or less.

In the method for producing a substrate for a printed circuit board, the sintered layer is formed by the application and sintering of the ink containing the metal particles, and in the sintering step or the downstream step, the porosity of the region of the sintered layer that has been formed by sintering the coating, the region extending from the interface between the sintered layer and the base film to the position 500 nm or less from the interface, is adjusted to 1% or more and 50% or less; thus, the peel strength between the base film and the sintered layer can be improved without impairing the strength of the base film due to excessive heat during the sintering. The method for producing a substrate for a printed circuit board requires no special equipment such as vacuum equipment, so that the substrate for a printed circuit board, the substrate having a high peel strength between the base film and the metal layer, i.e., the sintered layer, can be produced at a relatively low cost.

A method for producing a printed circuit board according to an embodiment of the present invention includes forming a conductive pattern by subjecting the printed circuit board to a subtractive process or a semi-additive process, the printed circuit board being produced by using a substrate for a printed circuit board obtained by the foregoing method for producing a substrate for a printed circuit board.

In the method for a printed circuit board, the inexpensive substrate for a printed circuit board, the substrate having a high peel strength between the base film and the sintered layer, is used; thus, the printed circuit board having a relatively high peel strength between the base film and the metal layer can be produced. In the method for a printed circuit board, the conductive pattern is formed by the subtractive process or semi-additive process commonly used; thus, the printed circuit board having a high peel strength between the base film and the metal layer can be produced at a relatively low cost.

The term "a sintered layer of metal particles" refers to a layer formed by sintering a plurality of metal particles. The phrase "a region of the sintered layer that has been formed by sintering the coating, the region extending from the interface between the sintered layer and the base film to a position 500 nm or less from the interface" refers to, in a portion of the sintered layer having a thickness less than 500 nm, a region within the range of the sintered layer. The term "porosity" refers to a value calculated as the area percentage of pores on a cross-sectional image by observation with an electron microscope. The term "sintering" includes not only a completely sintered state in which the particles are tightly bonded together but also a state in which particles are at a stage prior to a completely sintered state and are in close contact with each other to form solid bonds. The term "average particle size" refers to a particle size at 50% cumulative volume of a particle size distribution measured by a laser diffraction method. The term "main component" refers to a component whose content by mass is highest, preferably a component whose content is 90% or more by mass. The term "the vicinity of the interface" refers to a region extending from the interface between the base film and the sintered layer to a predetermined range in the thickness direction. The predetermined range may be, for example, a distance about half the thickness of the sintered layer, preferably 0.1 µm. The term "hydrophilization treatment" refers to treatment to reduce a contact angle measured by a sessile drop method specified in JIS-R3257 (1999).

[Details of Embodiments of the Present Invention]

A substrate for a printed circuit board according to embodiments of the present invention will be described in detail below with reference to the drawings.

[Substrate for Printed Circuit Board]

Figure 1:
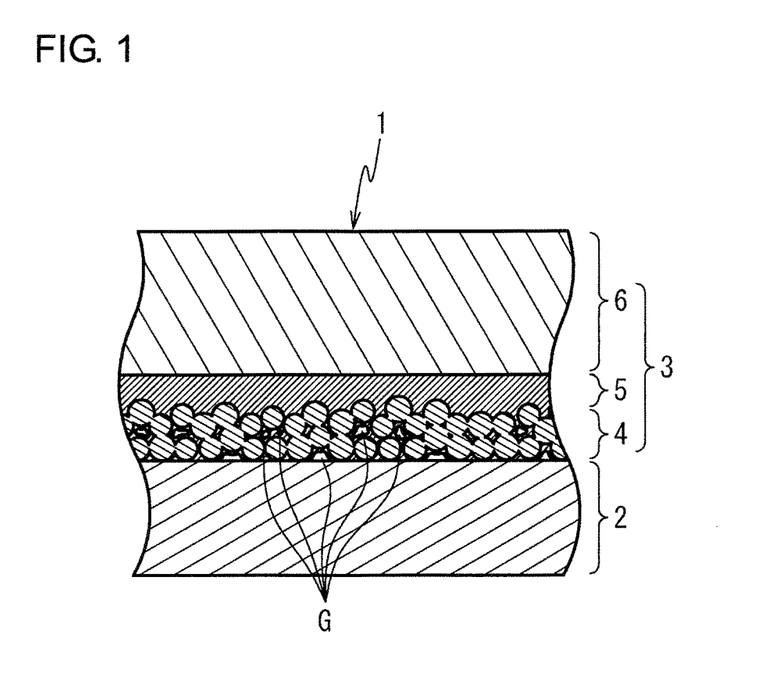
FIG. 1 is a schematic cross-sectional view of a substrate for a printed circuit board according to an embodiment of the present invention.

A substrate 1 for a printed circuit board illustrated in FIG. 1 includes a base film 2 having insulating properties and a metal layer 3 stacked on at least one surface of the base film 2.

The metal layer 3 is stacked on the at least one surface of the base film 2 and includes a sintered layer 4, a non-electrolytic plating layer 5 disposed on a surface of the sintered layer 4, and an electrolytic plating layer 6 stacked on one surface of the non-electrolytic plating layer 5, the sintered layer 4 being formed by sintering a plurality of metal particles, a plurality of pores G being contained in the sintered layer 4.

<Base Film>

Examples of a material that can be used for the base film 2 include flexible resins, such as polyimide, liquid-crystal polymers, fluororesins, poly(ethylene terephthalate), and poly(ethylene naphthalate); rigid materials, such as phenolic paper, epoxy paper, glass composites, glass epoxy, polytetrafluoroethylene, and glass substrates; and rigid-flexible materials in which hard materials and soft materials are combined together. Of these, polyimide is particularly preferred because polyimide has a high bonding strength to a metal oxide and so forth.

The thickness of the base film 2 is set, depending on a printed circuit board produced from the substrate for a printed circuit board, and is not particularly limited. For example, the lower limit of the average thickness of the base film 2 is preferably 5 µm, more preferably 12 µm. The upper limit of the average thickness of the base film 2 is preferably 2 mm, more preferably 1.6 mm. When the base film 2 has an average thickness less than the lower limit, the base film 2, and by extension the substrate for a printed circuit board, can have insufficient strength. When the base film 2 has an average thickness more than the upper limit, the substrate for a printed circuit board can have an unnecessarily large thickness.

A surface of the base film 2 on which the sintered layer 4 is stacked is preferably subjected to hydrophilization treatment to form a hydrophilized layer. Examples of the hydrophilization treatment that can be employed include plasma treatment in which a surface is hydrophilized by plasma irradiation; and alkali treatment in which a surface is hydrophilized with an alkali solution. The hydrophilization treatment of the base film 2 improves adhesion to the sintered layer 4 to improve the peel strength of the metal layer 3. When the sintered layer 4 is formed by the application and sintering of the ink containing the metal particles as described below, the surface tension of the ink against the base film 2 is reduced to facilitate the uniform application of the ink to the base film 2.

<Sintered Layer>

The sintered layer 4 is formed and stacked on the one surface of the base film 2 by sintering the metal particles.

(Metal Particles)

A metal mainly contained in the metal particles included in the sintered layer 4 is preferably a metal such that a metal oxide derived from the metal or a group derived from the metal oxide and a metal hydroxide derived from the metal or a group derived from the metal hydroxide are formed in a portion of the sintered layer 4 in the vicinity of the interface between the base film 2 and the sintered layer 4 of the substrate for a printed circuit board. Copper (Cu), nickel (Ni), aluminum (Al), gold (Au), or silver (Ag) may be used. Of these, copper is a metal having good conductivity and good adhesion to the base film 2 and thus is preferably used.

The lower limit of the average particle size of the metal particles included in the sintered layer 4 is preferably 1 nm, more preferably 30 nm. The upper limit of the average particle size of the metal particles is preferably 500 nm, more preferably 100 nm. When the average particle size of the metal particles is less than the lower limit, for example, it is possible that uniform lamination is not easily performed on the surface of the base film 2 because the metal particles have reduced dispersibility and stability in the ink. When the average particle size of the metal particles is more than the upper limit, it is possible that the porosity of the sintered layer 4 is not easily reduced because the pores have larger size between the metal particles.

The sintered layer 4 can be formed by, for example, the application and sintering of the ink containing the metal particles. In this way, the metal layer 3 can be easily formed on the one surface of the base film 2 at a low cost by the use of the ink containing the metal particles.

The lower limit of the porosity of the region of the sintered layer 4 extending from the interface between the sintered layer 4 and the base film 2 to a position 500 nm or less from the interface is 1%, preferably 2%. The upper limit of the porosity of the region of the sintered layer 4 extending from the interface between the sintered layer 4 and the base film 2 to a position 500 nm or less from the interface is 50%, preferably 45%, more preferably 20%. When the porosity of the region of the sintered layer 4 extending from the interface between the sintered layer 4 and the base film 2 to a position 500 nm or less from the interface is less than the lower limit, sintering is required to be performed at a high temperature for a prolonged period of time in order to reduce the porosity. This leads to the degradation of the base film 2, possibly resulting in an insufficient peel strength between the base film 2 and the metal layer 3. When the porosity of the region of the sintered layer 4 extending from the interface between the sintered layer 4 and the base film 2 to a position 500 nm or less from the interface is more than the upper limit, the contact area between the base film 2 and the sintered layer 4 is reduced, thus possibly resulting in an insufficient peel strength between the base film 2 and the metal layer 3.

The lower limit of the average thickness of the sintered layer 4 is preferably 50 nm, more preferably 100 nm. The upper limit of the average thickness of the sintered layer 4 is preferably 2 μm, more preferably 1.5 μm. When the average thickness of the sintered layer 4 is less than the lower limit, portions where the metal particles are not present are increased in plan view, thus possibly reducing the conductivity. When the average thickness of the sintered layer 4 is more than the upper limit, it can be difficult to sufficiently reduce the porosity of the sintered layer 4. Furthermore, the metal layer 3 can have an unnecessarily large thickness.

The metal oxide derived from the metal of the metal particles, the group derived from the metal oxide (also referred to collectively as a "metal oxide or the like"), the metal hydroxide derived from the metal, or the group derived from the metal hydroxide (also referred to collectively as a "metal hydroxide or the like") is preferably present in the vicinity of the interface between the base film 2 and the sintered layer 4. In particular, both of the metal oxide and the metal hydroxide are preferably present. The metal oxide or the like and the metal hydroxide or the like are an oxide and a hydroxide derived from the metal particles. The metal oxide or the like and the metal hydroxide or the like have a relatively high adhesion to both of the base film 2 composed of a resin or the like and the sintered layer composed of the metal. Thus, the presence of the metal oxide or the like or the metal hydroxide or the like in the vicinity of the interface between the base film 2 and the sintered layer 4 improves the peel strength between the base film 2 and the sintered layer 4. For example, when copper is used for the metal particles, copper oxide (CuO) or a group derived from the copper oxide and copper hydroxide (Cu(OH)$_2$) or a group derived from copper hydroxide can be formed and present in the vicinity of the interface between the base film 2 and the sintered layer 4.

The lower limit of the amount of the metal oxide or the like present per unit area in the vicinity of the interface between the base film 2 and the sintered layer 4 is preferably 0.1 μg/cm$^2$, more preferably 0.15 μg/cm$^2$. The upper limit of the amount of the metal oxide or the like present per unit area is preferably 10 μg/cm$^2$, more preferably 5 μg/cm$^2$, even more preferably 1 μg/cm$^2$. When the amount of the metal oxide or the like present per unit area is less than the lower limit, the effect of the metal oxide on the improvement of the peel strength between the base film 2 and the sintered layer 4 can be decreased. When the amount of the metal oxide or the like present per unit area is more than the upper limit, the sintering of the metal particles can be difficult to control.

The lower limit of the amount of the metal hydroxide or the like present per unit area in the vicinity of the interface between the base film 2 and the sintered layer 4 is preferably 0.5 μg/cm$^2$, more preferably 1.0 μg/cm$^2$. The upper limit of the amount of the metal hydroxide or the like present per unit area is preferably 10 μg/cm$^2$, more preferably 5 μg/cm$^2$. When the amount of the metal hydroxide or the like present per unit area is less than the lower limit, a large amount of the metal oxide or the like is formed; thus, the sintering of the metal particles can be difficult to control. When the amount of the metal hydroxide or the like present per unit area is more than the upper limit, the metal oxide or the like is relatively reduced; thus, the metal oxide can fail to improve the peel strength between the sintered layer 4 and the base film 2.

The lower limit of the ratio of the amount of the metal oxide or the like present to the amount of the metal hydroxide or the like present in the vicinity of the interface of the base film 2 and the sintered layer 4 is preferably 0.1, more preferably 0.2. The upper limit of the ratio is preferably 5, more preferably 3, even more preferably 1. When the ratio is less than the lower limit, the amount of the metal hydroxide or the like is excessively larger than the amount of the metal oxide or the like in the vicinity of the interface; thus, the peel strength between the base film 2 and the sintered layer 4 can fail to be improved. When the ratio is more than the upper limit, the sintering of the metal particles can be difficult to control.

<Non-electrolytic Plating Layer>

The non-electrolytic plating layer 5 is formed by subjecting the outer surface of the sintered layer 4 to non-electrolytic plating. The non-electrolytic plating layer 5 is formed in such a manner that the sintered layer 4 is impregnated with the non-electrolytic plating layer 5. That is, a non-electrolytic plating metal is charged into the pores between the metal particles included in the sintered layer 4 to reduce the pores G inside the sintered layer 4. In this way, the non-electrolytic plating metal is charged into the pores between the metal particles to reduce the pores G, thereby inhibiting the peeling of the sintered layer 4 from the base film 2 due to the pores G that act as starting points for fracture.

As a metal used for the non-electrolytic plating, for example, copper, nickel, and silver, which are highly conductive, may be used. When copper is used for the metal particles included in the sintered layer 4, copper or nickel is preferably used in view of adhesion to the sintered layer 4.

In some cases, the non-electrolytic plating layer 5 is formed only in the sintered layer 4, depending on the conditions of the non-electrolytic plating. Typically, the lower limit of the average thickness (not including the thickness of the plated metal in the sintered layer 4) of the non-electrolytic plating layer 5 formed on the outer surface of the sintered layer 4 is preferably 0.2 μm, more preferably 0.3 μm. The upper limit of the average thickness of the non-electrolytic plating layer 5 formed on the outer surface of the sintered layer 4 is preferably 1 μm, more preferably 0.5 μm. When the average thickness of the non-electrolytic plating layer 5 formed on the outer surface of the sintered layer 4 is less than the lower limit, the non-electrolytic plating layer 5 is not sufficiently charged into the pores between the metal particles in the sintered layer 4. This results in failure to sufficiently reduce the porosity, thus possibly leading to an insufficient peel strength between the base film 2 and the metal layer 3. When the average thickness of the non-electrolytic plating layer 5 formed on the outer surface of the sintered layer 4 is more than the upper limit, the time required for the non-electrolytic plating is prolonged. This can unnecessarily increase the production cost.

<Electrolytic Plating Layer>

The electrolytic plating layer 6 is stacked on the side of the outer surface of the sintered layer 4, i.e., on the outer surface of the non-electrolytic plating layer 5, by electrolytic plating. The thickness of the metal layer 3 can be easily and accurately adjusted by the electrolytic plating layer 6. The use of electrolytic plating enables the thickness of the metal layer 3 to be increased in a short time.

As a metal used for the electrolytic plating, for example, copper, nickel, or silver, which is good conductive, may be used. Of these, copper is preferred because it is inexpensive and has excellent conductivity.

The thickness of the electrolytic plating layer 6 is set, depending on the type and thickness of a conductive pattern required for a printed circuit board to be formed from the substrate 1 for a printed circuit board, and is not particularly limited. Typically, the lower limit of the average thickness of the electrolytic plating layer 6 is preferably 1 μm, more preferably 2 μm. The upper limit of the average thickness of the electrolytic plating layer 6 is preferably 100 μm, more preferably 50 μm. When the average thickness of the electrolytic plating layer 6 is less than the lower limit, the metal layer 3 can be easily damaged. When the average thickness of the electrolytic plating layer 6 is more than the upper limit, the substrate 1 for a printed circuit board can have an unnecessarily large thickness, and the substrate 1 for a printed circuit board can have insufficient flexibility.

[Method for Producing Substrate for Printed Circuit Board]

A method for producing a substrate for a printed circuit board includes the steps of forming metal particles, preparing an ink with the metal particles formed in the metal particle formation step, applying the ink that has been prepared in the ink preparation step to one surface of the base film 2 having insulating properties, sintering the resulting coating of the ink that has been formed in the application step, subjecting the outer surface of the sintered layer 4 that has been formed in the sintering step to non-electrolytic plating, and subjecting the side of the outer surface of the of the sintered layer 4 (outer surface of the non-electrolytic plating layer) to electrolytic plating.

In the method for producing a substrate for a printed circuit board, the porosity of a region of the sintered layer 4 extending from the interface between the sintered layer 4 and the base film 2 to a position 500 nm or less from the interface is adjusted within the foregoing range in the sintering step, the non-electrolytic plating step, and/or the electrolytic plating step.

<Metal Particle Formation Step>

Examples of a method for forming the metal particles in the metal particle formation step include a high-temperature treatment method, a liquid-phase reduction method, and a gas-phase method. Of these, the liquid-phase reduction method is preferably employed in which metal ions are reduced with a reductant in an aqueous solution to precipitate metal particles.

A specific method for forming the metal particles by the liquid-phase reduction method may be, for example, a method including a reduction step of subjecting metal ions to a reduction reaction with a reductant for a certain period of time in a solution of a water-soluble metal compound and a dispersant dissolved in water, the water-soluble metal compound serving as the origin of metal ions to be formed into metal particles.

Examples of the water-soluble metal compound that serves as the origin of the metal ions are as follows: In the case of copper, examples thereof include copper(II) nitrate $(Cu(NO_3)_2)$ and copper(II) sulfate pentahydrate $(CuSO_4.5H_2O)$. In the case of silver, examples thereof include silver(I) nitrate $(AgNO_3)$ and silver methanesulfonate $(CH_3SO_3Ag)$. In the case of gold, an example thereof is hydrogen tetrachloroaurate(III) tetrahydrate $(HAuCl_4.4H_2O)$. In the case of nickel, examples thereof include nickel(II) chloride hexahydrate $(NiCl_2.6H_2O)$ and nickel(II) nitrate hexahydrate $(Ni(NO_3)_2.6H_2O)$. For other metal particles, water-soluble compounds such as chlorides, nitrate compounds, and sulfate compounds, may also be used.

As the reductant used in producing the metal particles by the liquid-phase reduction method, various reductants capable of reducing and precipitating metal ions in the reaction system of a liquid phase (aqueous solution) may be used. Examples of the reductant include sodium borohydride, sodium hypophosphite, hydrazine, transition metal ions such as trivalent titanium ions and divalent cobalt ions, ascorbic acid, reducing sugars such as glucose and fructose, and polyhydric alcohols such as ethylene glycol and glycerol.

Among these, a method in which metal ions are reduced to precipitate metal particles by redox action when trivalent titanium ions are oxidized to tetravalent titanium ions is a titanium redox method. Metal particles produced by the titanium redox method have a small, uniform particle size and an almost spherical shape. It is thus possible to form a dense layer of metal particles to easily reduce the pores G in the sintered layer 4.

The adjustment of the particle size of the metal particles may be performed by adjusting the types and mixing ratio of the metal compound, the dispersant, and the reductant and adjusting the rate of stirring, the temperature, the time, the pH, and so forth in the reduction step of subjecting the metal compound to a reduction reaction.

In particular, the lower limit of the temperature in the reduction step is preferably 0° C., more preferably 15° C. The upper limit of the temperature in the reduction step is preferably 100° C., more preferably 60° C., even more preferably 50° C. A temperature lower than the lower limit in the reduction step can result in a low efficiency of the reduction reaction. A temperature higher than the upper limit in the reduction step can fail to easily adjust the particle size because of a high growth rate of the metal particles.

To produce metal particles having a small particle size in this embodiment, the pH of the reaction system in the reduction step is preferably 7 or more and 13 or less. At this time, the use of a pH modifier can adjust the pH of the reaction system to the range described above. Examples of the pH modifier that can be used include common acids and alkalis, such as hydrochloric acid, sulfuric acid, sodium hydroxide, and sodium carbonate. To particularly prevent the degradation of peripheral members, nitric acid and ammonia are preferred, the nitric acid and ammonia being free from impurity elements, for example, alkali metals, alkaline-earth metals, halogen elements such as chlorine, sulfur, phosphorus, and boron.

<Ink Preparation Step>

In the foregoing ink preparation step, the ink containing the metal particles to be formed into the sintered layer 4 is prepared. As the ink containing the metal particles, an ink containing a dispersion medium for the metal particles and a dispersant that uniformly disperses the metal particles in the dispersion medium is preferably used. The use of the ink in which the metal particles are uniformly dispersed enables the metal particles to be uniformly attached to the surface of the base film 2, thereby uniformly forming the sintered layer 4 on the surface of the base film 2.

Although the dispersant contained in the ink is not particularly limited, a polymer dispersant having a molecular weight of 2,000 or more and 300,000 or less is preferably used. The use of the polymer dispersant having a molecular weight within the range described above enables the metal particles to be satisfactorily dispersed in the dispersion medium, thus resulting in the dense and defect-free sintered layer 4. When the molecular weight of the dispersant is less than the lower limit, the effect of preventing the aggregation of the metal particles to maintain the dispersion can fail to be sufficiently provide. It is thus possible that a dense sintered layer having few defects cannot be stacked on the base film 2. When the molecular weight of the dispersant is more than the upper limit, the dispersant is excessively bulky; thus, the dispersant can inhibit the sintering of the metal particles to form voids in the sintering step after the application of the ink. When the dispersant is excessively bulky, the density level of the sintered layer 4 can be reduced, and the decomposition residues of the sintered layer 4 can reduce the conductivity.

Preferably, the dispersant does not contain sulfur, phosphorus, boron, halogens, or alkalis from the viewpoint of preventing the degradation of components. Preferred examples of the dispersant include amine-based polymer dispersants such as polyethyleneimine and polyvinylpyrrolidone; hydrocarbon-based polymer dispersants each having a carboxylic acid group in its molecule, such as polyacrylic acid and carboxymethyl cellulose; polymer dispersants each having a polar group, such as Poval (poly(vinyl alcohol)), styrene-maleic acid copolymers, olefin-maleic acid copolymers, and copolymers each having a polyethyleneimine moiety and a polyethylene oxide moiety in one molecule thereof, all of these dispersants each having a molecular weight within the range described above.

The dispersant can also be added to the reaction system in the form of a solution in which the dispersant is dissolved in water or a water-soluble organic solvent. The dispersant content is preferably 1 part or more by mass and 60 parts or less by mass per 100 parts by mass of the metal particles. The dispersant surrounds the metal particles to prevent aggregation of the metal particles, thus satisfactorily dispersing the metal particles. When the dispersant content is less than the lower limit, the effect of preventing the aggregation can be insufficient. When the dispersant content is more than the upper limit, in the sintering step after the application of the ink, an excessive amount of the dispersant can inhibit the sintering of the metal particles to form voids. Furthermore, the decomposition residues of the polymer dispersant can be left as impurities in the sintered layer to reduce the conductivity.

The content of water serving as a dispersion medium in the ink is preferably 20 parts or more by mass and 1,900 parts or less by mass per 100 parts by mass of the metal particles. Water serving as the dispersion medium sufficiently swells the dispersant to satisfactorily disperse the metal particles surrounded by the dispersant. When the content of water is less than the lower limit, the effect of water on the swelling of the dispersant can be insufficient. When the content of water is more than the upper limit, the proportion of the metal particles in the ink is low, thus possibly failing to form a satisfactory sintered layer having a necessary thickness and density on the surface of the base film 2.

As an organic solvent mixed with the ink, as needed, various water-soluble organic solvents can be used. Specific examples thereof include alcohols such as methyl alcohol, ethyl alcohol, n-propyl alcohol, isopropyl alcohol, n-butyl alcohol, isobutyl alcohol, sec-butyl alcohol, and tert-butyl alcohol; ketones such as acetone and methyl ethyl ketone; polyhydric alcohols such as ethylene glycol and glycerol, and other esters; and glycol ethers such as ethylene glycol monoethyl ether and diethylene glycol monobutyl ether.

The content of the water-soluble organic solvent is preferably 30 parts or more by mass and 900 parts or less by mass per 100 parts by mass of the metal particles. When the content of the water-soluble organic solvent is less than the lower limit, the effect of the organic solvent on the adjustment of the viscosity and the vapor pressure of the dispersion can fail to be provided. When the content of the water-soluble organic solvent is more than the upper limit, the effect of swelling the dispersant with water can be insufficient to cause the aggregation of the metal particles in the ink.

In the case of producing the metal particles by the liquid-phase reduction method, the metal particles precipitated in a liquid-phase reaction system (aqueous solution) are subjected to steps of filtration, washing, drying, disintegration, and so forth into a powder, and the ink can be prepared with the powder. In this case, the powdery metal particles, water serving as a dispersion medium, a dispersant, and, optionally, a water-soluble organic solvent can be mixed together in predetermined proportions to prepare the ink containing the metal particles. The ink is preferably prepared with the liquid phase (aqueous solution) in which the metal particles have been precipitated, the liquid phase serving as a starting material. Specifically, the liquid phase (aqueous solution) containing the precipitated metal particles is subjected to treatment, for example, ultrafiltration, centrifugal separation, washing with water, or electrodialysis, for the removal of impurities and, optionally, concentration for the removal of water. Alternatively, water is added to the liquid phase to adjust the concentration of the metal particles, and, optionally, a water-soluble organic solvent is added in a predetermined proportion, thereby preparing the ink containing the metal particles. In this method, the formation of coarse, irregular particles due to aggregation of the metal particles during drying can be prevented, thereby easily forming the dense, uniform sintered layer 4.

<Application Step>

In the foregoing application step, the ink is applied to one surface of the base film 2. As a method for applying the ink, for example, a known coating method, such as a spin coating method, a spray coating method, a bar coating method, a die coating method, a slit coating method, a roll coating method, or a dip coating method, can be employed. The ink may be applied to only part of one surface of the base film 2 by screen printing or with a dispenser or the like.

<Sintering Step>

In the sintering step, the coating of the ink formed by applying the ink to one surface of the base film 2 is preferably dried and then sintered by heat treatment. Thereby, the dispersant in the solvent of the ink is evaporated or thermally decomposed, and the remaining metal particles are sintered to form the sintered layer 4 fixed on the one surface of the base film 2.

In a portion of the sintered layer 4 in the vicinity of the interface between the sintered layer 4 and the base film 2, the metal particles are oxidized during the sintering to form an metal oxide derived from the metal or a group derived from the metal oxide while the formation of a metal hydroxide derived from the metal of the metal particles or a group derived from the metal hydroxide is inhibited. Specifically, for example, when metal particles composed of copper are used, copper oxide and copper hydroxide are formed in a portion of the sintered layer 4 in the vicinity of the interface between the sintered layer 4 and the base film 2. The amount of copper oxide formed is larger than that of the latter. Copper oxide formed in the portion of the sintered layer 4 in the vicinity of the interface is strongly bonded to polyimide contained in the base film 2, thus increasing the peel strength between the base film 2 and the sintered layer 4.

The sintering is preferably performed in an atmosphere containing a certain amount of oxygen. The lower limit of the oxygen concentration in the atmosphere during the sintering is preferably 1 ppm by volume, more preferably 10 ppm by volume. The upper limit of the oxygen concentration is preferably 10,000 ppm by volume, more preferably 1,000 ppm by volume. When the oxygen concentration is less than the lower limit, the amount of copper oxide formed in the portion of the sintered layer 4 in the vicinity of the interface is small, thus possibly failing to sufficiently improve the adhesion between the base film 2 and the sintered layer 4. When the oxygen concentration is more than the upper limit, the metal particles can be excessively oxidized to reduce the conductivity of the sintered layer 4.

The lower limit of the sintering temperature is preferably 150° C., more preferably 200° C. The upper limit of the sintering temperature is preferably 500° C., more preferably 400° C. When the sintering temperature is lower than the lower limit, the amount of copper oxide formed in the portion of the sintered layer 4 in the vicinity of the interface is small, thus possibly failing to sufficiently improve the adhesion between the base film 2 and the sintered layer 4. When the sintering temperature is higher than the upper limit, the base film 2 can deform when the base film 2 is composed of an organic resin such as polyimide.

<Non-Electrolytic Plating Step>

In the non-electrolytic plating step, one surface of the sintered layer 4 stacked on the one surface of the base film 2 in the sintering step is subjected to non-electrolytic plating to form the non-electrolytic plating layer 5.

The non-electrolytic plating is preferably performed with treatment steps such as a cleaner step, a water-washing step, an acid treatment step, a water-washing step, a pre-dip step, an activator step, a water-washing step, a reduction step, and a water-washing step.

After the non-electrolytic plating layer 5 is formed by the non-electrolytic plating, heat treatment is preferably performed. By performing the heat treatment after the formation of the non-electrolytic plating layer 5, the metal oxide or the like in the portion of the sintered layer 4 in the vicinity of the interface between the sintered layer 4 and the base film 2 is further increased, thereby further increasing the adhesion between the base film 2 and the sintered layer 4. The temperature and the oxygen concentration during the heat treatment after the non-electrolytic plating may be the same as the sintering temperature and the oxygen concentration during the sintering step.

<Electrolytic Plating Step>

In the electrolytic plating step, the electrolytic plating layer 6 is stacked on the outer surface of the non-electrolytic plating layer 5 by electrolytic plating. The entire thickness of the metal layer 3 is increased to a desired thickness during the electrolytic plating step.

The electrolytic plating may be performed with a known electrolytic plating bath corresponding to a plating metal such as copper, nickel, or silver, under appropriate conditions in such a manner that the metal layer 3 having a desired thickness is rapidly formed without any defect.

[Advantage]

In the substrate 1 for a printed circuit board, the porosity of the region of the sintered layer 4 extending from the interface between the sintered layer 4 and the base film 2 to the position 500 nm or less from the interface is within the range described above; hence, excessive heat during the sintering does not decrease the strength of the base film 2 and the sintered layer 4, thus resulting in high peel strength between the base film 2 and the sintered layer 4 and, by extension, between the base film 2 and the metal layer 3.

The substrate 1 for a printed circuit board can be produced without any special equipment such as vacuum equipment and thus can be produced at a relatively low cost despite the high peel strength between the base film 2 and the metal layer 3.

[Printed Circuit Board]

The printed circuit board is formed by the subtractive process or semi-additive process with the substrate 1 for a printed circuit board illustrated in FIG. 1. More specifically, the printed circuit board is produced by forming a conductive pattern using the subtractive process or semi-additive process with the metal layer 3 of the substrate 1 for a printed circuit board. That is, the conductive pattern of the printed circuit board is formed by patterning the metal layer 3 (the sintered layer 4, the non-electrolytic plating layer 5, and the electrolytic plating layer 6).

In the subtractive process, a film of a photosensitive resist is formed on one surface of the substrate 1 for a printed circuit board illustrated in FIG. 1. The resist is patterned so as to correspond to a conductive pattern by exposure, development, and other operations. Subsequently, a portion of the metal layer 3 other than the conductive pattern is removed by etching with the patterned resist serving as a mask. Finally, removal of the remaining resist results in the printed circuit board including the remaining portion of the metal layer 3 of the substrate 1 for a printed circuit board.

Figure 2:
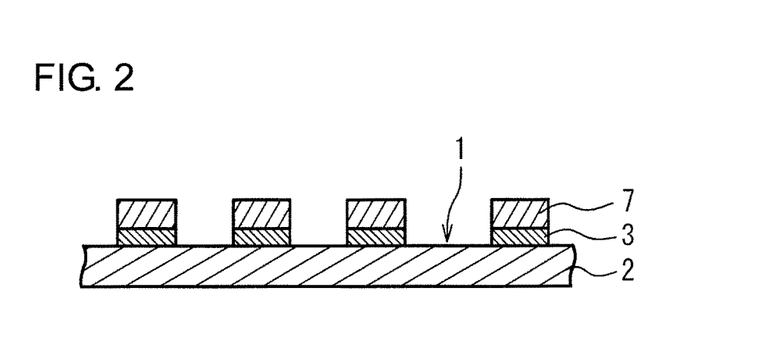
FIG. 2 is a schematic cross-sectional view of a printed circuit board according to an embodiment of the present invention.

In the semi-additive process, a film of a photosensitive resist is formed on one surface of the substrate 1 for a printed circuit board illustrated in FIG. 1. The resist is patterned by exposure, development, and other operations to form an opening corresponding to a conductive pattern. Subsequently, a conductive layer is selectively stacked by plating with the resist serving as a mask using the metal layer 3 exposed in the opening of the mask as a seed layer. After the resist is peeled off, a surface of the conductive layer and a portion of the metal layer 3 where the conductive layer is not formed are removed by etching, thereby resulting in the printed circuit board including the conductive pattern in which a conductive layer 7 is further stacked on the remaining portion of the metal layer 3 of the substrate 1 for a printed circuit board as illustrated in FIG. 2.

[Advantage]

The printed circuit board is produced with the substrate 1 for a printed circuit board and thus has a high adhesion between the base film 2 and the sintered layer 4 and a high peel strength between the base film 2 and the metal layer 3, so that the conductive pattern is not readily peeled.

The printed circuit board is formed by the common subtractive process or semi-additive process with the inexpensive substrate 1 for a printed circuit board and thus can be produced at a low cost.

[Other Embodiments]

The embodiments disclosed herein are to be considered in all respects as illustrative and not limiting. The scope of the invention is defined not by the configurations of the foregoing embodiments but by the following claims, and is intended to include any modifications within the scope and meaning equivalent to the scope of the claims.

The substrate for a printed circuit board may include the metal layer arranged on each surface of the base film.

The sintered layer of the substrate for a printed circuit board may be formed by stacking the metal particles on a surface of the base film using another means without using an ink and sintering the metal particles.

In the substrate for a printed circuit board, one or both of the non-electrolytic plating layer and the electrolytic plating layer may be omitted. However, when the metal layer is required to have an average thickness of 1 µm or more, the thickness is preferably increased by forming an electrolytic plating layer.

EXAMPLES

While the present invention will be described in detail below by examples, the present invention is not interpreted as being limited to the description of the examples.
<Experimental Production of Substrate for Printed Circuit Board>

To verify the advantageous effects of the present invention, eight types of substrates for printed circuit boards, the substrates being produced under different production conditions, were produced and denoted by prototype Nos. 1 to 8.

(Prototype No. 1)

Figure 3:
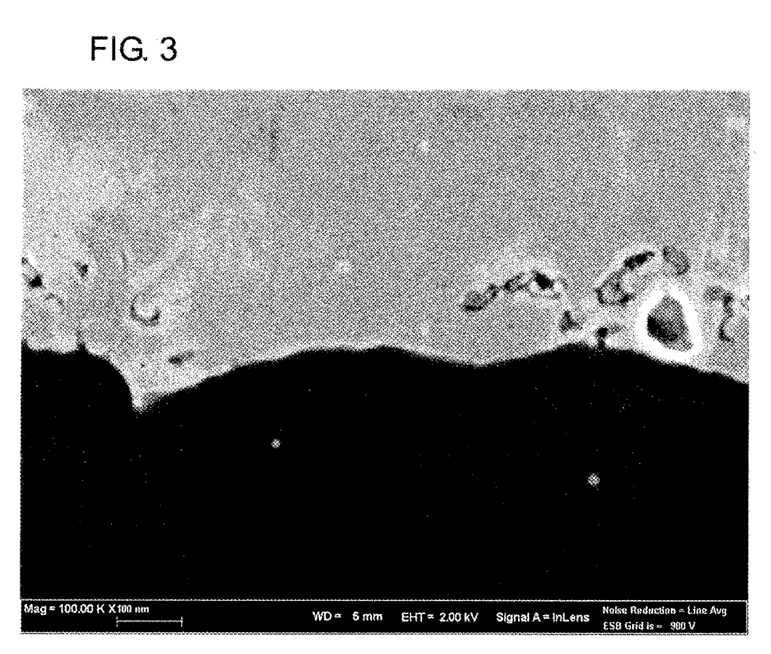
FIG. 3 is an electron micrograph of a cross section of a prototype of a substrate for a printed circuit board.

Copper particles having an average particle size of 75 nm were used as metal particles and dispersed in water serving as a solvent to prepare an ink having a copper concentration of 26% by mass. A polyimide film (Kapton "EN-S", available from Du Pont-Toray Co., Ltd.) having an average thickness of 12 µm was used as a base film having insulating properties. The ink was applied to one surface of the polyimide film and dried in air to form a dry coating having an average thickness of 0.15 µm. Subsequently, the dry coating formed on the polyimide film was sintered at 350° C. for 30 minutes in a nitrogen atmosphere having an oxygen concentration of 10 ppm by volume to form a sintered layer. One surface of the sintered layer was subjected to non-electrolytic plating of copper to form a non-electrolytic plating layer having an average thickness of 0.3 µm from the outer surface of the sintered layer. Heat treatment was further performed at 350° C. for 2 hours in a nitrogen atmosphere having an oxygen concentration of 150 ppm by volume. Then electrolytic plating was performed to form an electrolytic plating layer in such a manner that the entire metal layer had an average thickness of 18 µm, thereby resulting in prototype No. 1 of a substrate for a printed circuit board. FIG. 3 illustrates a photomicrograph of a cross section of the prototype No. 1 of the substrate for a printed circuit board.

(Prototype No. 2)

Prototype No. 2 of a substrate for a printed circuit board was produced in the same way as prototype No. 1, except that copper particles having an average particle size of 93 nm were used as the metal particles and the temperature of the heat treatment was 320° C.

(Prototype No. 3)

Prototype No. 3 of a substrate for a printed circuit board was produced in the same way as prototype No. 1, except that copper particles having an average particle size of 162 nm were used as the metal particles and the temperature of the heat treatment was 320° C.

(Prototype No. 4)

Prototype No. 4 of a substrate for a printed circuit board was produced in the same way as prototype No. 1, except that copper particles having an average particle size of 345 nm were used as the metal particles.

(Prototype No. 5)

Figure 4:
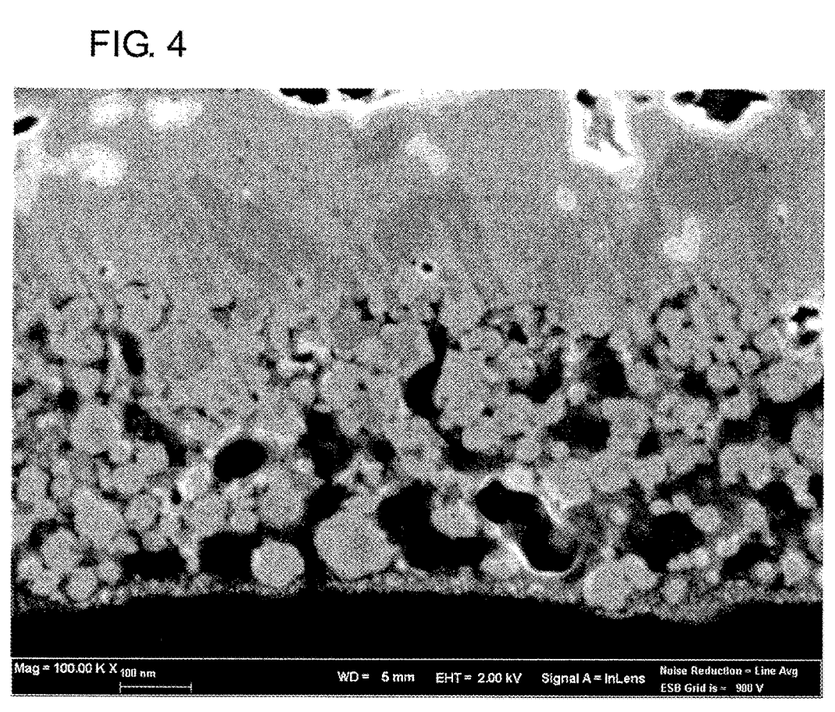
FIG. 4 is an electron micrograph of a cross section of another prototype of a substrate for a printed circuit board.

Prototype No. 5 of a substrate for a printed circuit board was produced in the same way as prototype No. 1, except that copper particles having an average particle size of 360 nm were used as the metal particles and the temperature of the heat treatment was 300° C. FIG. 4 illustrates a photomicrograph of a cross section of prototype 5 of a substrate for a printed circuit board.

(Prototype No. 6)

Prototype No. 6 of a substrate for a printed circuit board was produced in the same way as prototype No. 1, except that copper particles having an average particle size of 541 nm were used as the metal particles.

(Prototype No. 7)

Prototype No. 7 of a substrate for a printed circuit board was produced in the same way as prototype No. 1, except that copper particles having an average particle size of 586 nm were used as the metal particles, the sintering temperature was 300° C., and the temperature of the heat treatment was 250° C.

(Prototype No. 8)

Prototype No. 8 of a substrate for a printed circuit board was produced in the same way as prototype No. 1, except that the sintering temperature was 450° C. and the sintering time was 8 hours.

<Peel Strength>

The peel strength (gf/cm) between the polyimide film and the conductive layer of each of prototypes Nos. 1 to 8 of the substrates for printed circuit boards was measured. The peel strength was measured in accordance with JIS-C6471 (1995), i.e., by a method in which the conductive layer is peeled from the polyimide film at a peel angle of 180° with respect to the polyimide film. It is believed that the lower limit of the peel strength between the base film and the metal layer of the printed circuit board is preferably 300 gf/cm, more preferably 600 gf/cm.

<Porosity>

By analyzing a cross-sectional image of each of prototype Nos. 1 to 8 of the substrates for printed circuit boards, the cross-sectional image being observed with a scanning electron microscope at a magnification of ×100,000, the porosity of a region extending from the interface between the base film and the sintered layer to a position 500 nm or less from the interface in the field of view having a width of 1 µm was measured three times, and the average was calculated. As the foregoing scanning electron microscope, "ULTRA 55" available from ZEISS was used.

<Amounts of Copper Oxide or the Like and Copper Hydroxide or the Like Present>

In each of prototype Nos. 1 to 8 of the substrates for printed circuit boards, the amounts of copper oxide or the like and copper hydroxide or the like present on a surface of the metal layer that had been stacked on the polyimide film and then peeled for the measurement of the peel strength were measured by an evaluation method using electrochemical measurement. Specifically, a three-electrode electrochemical measurement cell was connected to a commercially available potentiostat, and then a certain potential was applied to measure a change in current. In this electrochemical measurement, a strong alkaline aqueous solution containing $Li^+$ ions (6 M KOH and 1 M LiOH) was used as an electrolytic solution. A silver-silver chloride (Ag/AgCl) electrode was used as a reference electrode immersed in the electrolytic solution. A platinum (Pt) electrode was used as a counter electrode. The peeled metal layer was used as a target for measurement. A potential of the metal layer with respect to the reference electrode was swept to negative potentials at a constant rate, and a current flowing by the reduction of copper oxide or the like or copper hydroxide or the like was measured. Specifically, the potential between the reference electrode and the metal layer and the current value measured against the change in potential were graphed. The presence or absence of copper oxide or the like and copper hydroxide or the like is checked from the peak potential of the graph, and the quantification was performed from the peak area (the quantity of electricity).

<Ratio of Amount of Copper Oxide or the Like Present to Amount of Copper Hydroxide or the Like Present>

In each of prototype Nos. 1 to 8 of the substrates for printed circuit boards, the ratio of the amount of copper oxide or the like present to the amount of copper hydroxide or the like present was calculated from the measurement results of the amounts of copper oxide or the like and copper hydroxide or the like present.

Table 1 lists the measurement results of the peel strength, the measurement results of the porosity, the measurement results of the amounts of copper oxide or the like and copper hydroxide or the like present, and the calculated ratios of the amounts of copper oxide or the like present to the amounts of copper hydroxide or the like present of prototype Nos. 1 to 8 of the substrates for printed circuit boards.

TABLE 1

| Prototype No. | Peel strength (gf/cm) | Porosity (%) | Copper oxide ($\mu g/cm^2$) | Copper hydroxide ($\mu g/cm^2$) | Copper oxide/ copper hydroxide |
|---|---|---|---|---|---|
| 1 | 1010 | 3 | 0.86 | 1.11 | 0.77 |
| 2 | 940 | 10 | 0.40 | 0.72 | 0.56 |
| 3 | 720 | 28 | 0.32 | 1.05 | 0.30 |
| 4 | 700 | 42 | 0.28 | 1.23 | 0.23 |
| 5 | 320 | 39 | 0.11 | 1.50 | 0.07 |
| 6 | 250 | 65 | 0.16 | 0.61 | 0.26 |
| 7 | 180 | 58 | 0.20 | 2.38 | 0.08 |
| 8 | 120 | 0.6 | 0.10 | 1.45 | 0.07 |

<Evaluation Result>

The results listed in Table 1 indicate that each of the substrates for a printed circuit boards of prototype Nos. 1 to 5 had a high peel strength of 300 gf/cm or more and that the peel strength between the base film and the metal layer was sufficiently high. From these results, when the porosity of the region extending from the interface between the base film and the sintered layer to the position 500 nm or less from the interface is within a certain range, a sufficient peel strength can be provided. In contrast, the substrates for a printed circuit boards of prototype Nos. 6 and 7 had a low peel strength. This is presumably because they have an excessively high porosity. The substrate for a printed circuit board of prototype No. 8 had a low peel strength. This is presumably because the base film was degraded by firing at a high temperature in order to reduce the porosity.

The substrates for printed circuit boards of prototype Nos. 1 to 4 have a peel strength of 600 gf/cm or more and thus are particularly preferred. The reason for this is presumably that the ratio of the amount of copper oxide or the like present to the amount of copper hydroxide or the like present in each of the substrates for printed circuit boards is relatively high. In contrast, in the substrate for a printed circuit board of prototype No. 5, the ratio of the amount of copper oxide or the like present to the amount of copper hydroxide or the like present is low. It is thus believed that the effect of further improving the peel strength was not provided.

INDUSTRIAL APPLICABILITY

The substrate for a printed circuit board and the printed circuit board according to the embodiments of the present invention are suitably used for flexible printed circuit boards used in applications in which a high bending load is applied.

REFERENCE SIGNS LIST 1 substrate for a printed circuit board
2 base film
3 metal layer
4 sintered layer
5 non-electrolytic plating layer
6 electrolytic plating layer
7 conductive layer
G pore

The invention claimed is:

1. A substrate for a printed circuit board, comprising:
a base film having insulating properties; and
a sintered layer formed of a plurality of metal particles, the sintered layer being stacked on at least one surface of the base film,
wherein a region of the sintered layer extending from an interface between the sintered layer and the base film to a position 500 nm or less from the interface has a porosity of 1% or more and 50% or less,
wherein a metal oxide derived from a metal of the metal particles, a group derived from the metal oxide, a metal hydroxide derived from the metal, or a group derived from the metal hydroxide is present in a vicinity of an interface between the base film and the sintered layer,
wherein the metal oxide or the group derived from the metal oxide in the vicinity of the interface between the base film and the sintered layer is present in an amount of 0.1 $\mu g/cm^2$ or more and 10 $\mu g/cm^2$ or less per unit area, and
wherein the metal oxide derived from the metal of the metal particles or the group derived from the metal oxide and the metal hydroxide derived from the metal or the group derived from the metal hydroxide are present,
the ratio of an amount of the metal oxide or the group derived from the metal oxide present to an amount of the metal hydroxide or the group derived from the metal hydroxide present is 0.1 or more.

2. The substrate for a printed circuit board according to claim 1, wherein the metal particles have an average particle size of 1 nm or more and 500 nm or less.

3. The substrate for a printed circuit board according to claim 1, wherein each of the metal particles comprises copper or a copper alloy as a main component.

4. The substrate for a printed circuit board according to claim 1, further comprising a non-electrolytic plating layer on an outer surface of the sintered layer.

5. The substrate for a printed circuit board according to claim 1, further comprising an electrolytic plating layer stacked on the side of the outer surface of the sintered layer.

6. The substrate for a printed circuit board according to claim 1, further comprising a hydrophilized layer on the surface of the base film on which the sintered layer is stacked.

7. A printed circuit board comprising the substrate for a printed circuit board according to claim 1, the sintered layer being patterned.

8. A method for producing a substrate for a printed circuit board, the substrate including:
- a base film having insulating properties; and
- a sintered layer formed of a plurality of metal particles, the sintered layer being stacked on at least one surface of the base film, the method comprising the steps of:
- applying an ink containing the metal particles to one surface of the base film having insulating properties; and
- sintering a coating of the ink that has been formed in the application step,
- wherein in the sintering step or a downstream step thereof, a porosity of a region of the sintered layer that has been formed by sintering the coating, the region extending from an interface between the sintered layer and the base film to a position 500 nm or less from the interface, is adjusted to 1% or more and 50% or less,
- wherein a metal oxide derived from a metal of the metal particles, a group derived from the metal oxide, a metal hydroxide derived from the metal, or a group derived from the metal hydroxide is present in a vicinity of an interface between the base film and the sintered layer,
- wherein the metal oxide or the group derived from the metal oxide in the vicinity of the interface between the base film and the sintered layer is present in an amount of 0.1 $\mu g/cm^2$ or more and 10 $\mu g/cm^2$ or less per unit area, and
- wherein the metal oxide derived from the metal of the metal particles or the group derived from the metal oxide and the metal hydroxide derived from the metal or the group derived from the metal hydroxide are present,
- the ratio of an amount of the metal oxide or the group derived from the metal oxide present to an amount of the metal hydroxide or the group derived from the metal hydroxide present is 0.1 or more.

9. A method for producing a printed circuit board, comprising forming a conductive pattern by subjecting the printed circuit board to a subtractive process or a semi-additive process, the printed circuit board being produced by using a substrate for a printed circuit board obtained by the method for producing a substrate for a printed circuit board according to claim 8.

* * * * *